United States Patent [19]

Mayer

[11] 4,269,505

[45] May 26, 1981

[54] DEVICE FOR THE PROJECTION PRINTING OF THE MASKS OF A MASK SET ONTO A SEMICONDUCTOR SUBSTRATE

[75] Inventor: Herbert E. Mayer, Eschen, Austria

[73] Assignee: Censor Patent-und Versuchs-Anstalt, Vaduz, Liechtenstein

[21] Appl. No.: 83,532

[22] Filed: Oct. 10, 1979

[30] Foreign Application Priority Data

Oct. 19, 1978 [DE] Fed. Rep. of Germany ....... 2845603

[51] Int. Cl.³ .............................................. G03B 27/52
[52] U.S. Cl. ..................................... 355/62; 250/548; 356/152
[58] Field of Search .................... 356/152; 355/45, 53, 355/62, 43; 250/561, 575, 548

[56] References Cited

U.S. PATENT DOCUMENTS

| | | | |
|---|---|---|---|
| 3,494,695 | 2/1970 | Sollima et al. ..................... | 355/53 X |
| 3,796,497 | 3/1974 | Mathisen et al. .................... | 356/152 |
| 3,844,655 | 10/1974 | Johannsmeier ....................... | 355/43 |
| 3,865,483 | 2/1975 | Wojcik .................................. | 355/43 |

*Primary Examiner*—Richard A. Wintercorn
*Attorney, Agent, or Firm*—Haseltine and Lake

[57] ABSTRACT

A device for the projection printing of the masks of a mask set onto a semiconductor substrate comprising a projection lens for imaging the patterns of said masks on photosensitive layers of said substrate. Alignment patterns are disposed said masks and alignment targets on said substrate. Said alignment patterns of at least one of said masks and said alignment targets of said substrate are positioned in non-conjugated areas in respect of the projection lens, i.e. in areas which cannot be imaged into one another by means of said projection lens. For the alignment process between said mask and said substrate auxiliary optical means are provided, said alignment targets of said substrate and said alignment patterns of said mask being imaged into one another by means of said auxiliary optical means.

14 Claims, 4 Drawing Figures

DEVICE FOR THE PROJECTION PRINTING OF THE MASKS OF A MASK SET ONTO A SEMICONDUCTOR SUBSTRATE

BACKGROUND OF THE INVENTION

1. FIELD OF THE INVENTION

The present invention relates to a device for the projection printing of the masks of a mask set onto a workpiece, particularly onto a semiconductor substrate for the manufacture of integrated circuits.

2. DESCRIPTION OF THE PRIOR ART

In the production of integrated circuits it is necessary to subsequently image a number of masks having different circuit patterns on exactly the same area of the substrate. After development the photosensitive layer being exposed on the substrate serves for covering the substrate at desired points during chemical and physical process cycless, e.g. etching- and diffusing processes, carried out between the concsecutive images. In the manufacture of integrated circuits high demands are made to accuracy. Tolerable deviations of the consecutive images of the circuit patterns are, for example, less than 1 $\mu$m (0.039 mil.)

In order to obtain such accuracy the circuit patterns on the mask are usually imaged on the substrate by means of a projection lens, e.g. reduced by the factor 10. Before exposing a substrate or a portion of said substrate which has already been provided with circuit elements it is necessary to align alignment patterns of the mask with repetitive accuracy and relative to alignment targets marked on the substrate by aligning the masks, or, if required, the substrate, in order to obtain the desired covering of the successive circuit patterns.

In a first processing cycle of a prior art method alignment targets are produced on the virgin substrate for each chip by means of a mask and subsequent etching or by means of a laser, the masks required for the subsequent images of the individual circuit patterns being aligned to said alignment targets. In this step and repeat method each chip is exposed individually.

It is also known in the art to image the circuit patterns for a majority of or for all chips to be produced together on the substrate.

For the alignment process the respective alignment target portions on the substrate and the areas on the mask defining the alignment patterns are imaged into one another by means of the projection lens, the relative deviation being visually or metrologically determined. Positioning commands for the alignment mechanism, e.g. for the coordinate stage, are deduced from the deviation. In the aligned position the alignment targets and the alignment patterns are conjugated to one another.

It is a common problem to both methods that the alignment patterns of the mask are projected on the substrate during exposure and expose on the substrate the photosensitive layer in the area of the alignment targets. When the exposed or unexposed, photosensitive layer portions have been developed and removed, a portion on the substrate corresponding to the alignment pattern is uncovered and the alignment target usually becomes useless or is entirely etched away during a subsequent etching process. The target cannot be used for the alignment of the following mask.

When a negative, photosensitive layer is used on the substrate it has become known to prevent the optical printing of the alignment pattern by pre-exposing the area of the alignment target on the substrate.

When, however, a positive, photosensitive layer is used, the exposed layer is removed after processing, and the alignment pattern is destroyed during etching. When imaging a mask, a new alignment target for the next mask must be printed on the substrate. Thereby a disadvantageous addition of errors of alignment of the individual masks is caused.

SUMMARY OF THE INVENTION

It is, therefore, the object of the present invention to obviate the inevitable influence of the alignment pattern of the mask on the alignment target of the substrate.

According to the invention this is achieved by positioning said alignment patterns of masks and said alignment targets of said workpiece in non-conjugated areas in respect of the projection lens, i.e. in areas which cannot be imaged into one another by means of said projection lens, and wherein auxiliary optical means are provided for the alignment process, said alignment targets of said workpiece and said alignment patterns of said mask being imaged into one another by means of said auxiliary optical means.

It is an essential advantage of the present invention that the processor of the integrated circuit has a wide processing range. The processor can produce the areas of the mask being conjugated to the alignment targets of the substrate by means of the projection lens in such a manner that the alignment targets remain uninfluenced. It is possible to change the alignment targets in a certain manner, e.g. to mark smaller targets without depending on the shape of the alignment pattern on the mask. An alignment target can be deleted deliberately by means of any chosen masks, and in a following processing cycle a new target can be produced in the place of the deleted one.

If the alignment targets are to remain uninfluenced it is of advantage if the areas of the mask or of the exposure path being conjugated to the alignment targets of the workpiece in respect of the projection lens are light-tight in the case of a positive, photosensitive layer on the workpiece, and light-transmitting in the case of a negative, photosensitive layer.

It is also possible to dispose alignment patterns on masks outside the projection area of the projection lens.

It is of advantage to dispose the auxiliary optical means between the projection lens and the mask.

The auxiliary optical means may have at least two reflecting mirrors and, if required, one correction lens for one pair of alignment targets and alignment patterns each.

The auxiliary optical means can advantageously be realized by providing the mask on its side directed towards the projection lens with a protective glass, first mirrors being disposed on the surface of said protective glass in areas being conjugated to alignment targets on the substrate.

It is of advantage if said first mirrors are adapted to transmit the wavelength of the exposure radiation and to reflect the wavelength of the alignment radiation.

It is of further advantage to dispose second mirrors at a distance from the protective glass, said second mirrors imaging the images of the alignment targets of the substrate reflected from the first mirrors of the protective glass in the respective alignment patterns of the mask.

According to a further embodiment of the invention the auxiliary optical means or parts thereof are adapted to be moved into and out of the projection area of the projection lens.

BRIEF DESCRIPTION OF THE DRAWING

In the following embodiments of the invention will be described in more detail by means of the figures of the drawing without being limited thereto.

DESCRIPTION OF THE PREFERRED EMBODIMENT

Figure 1:
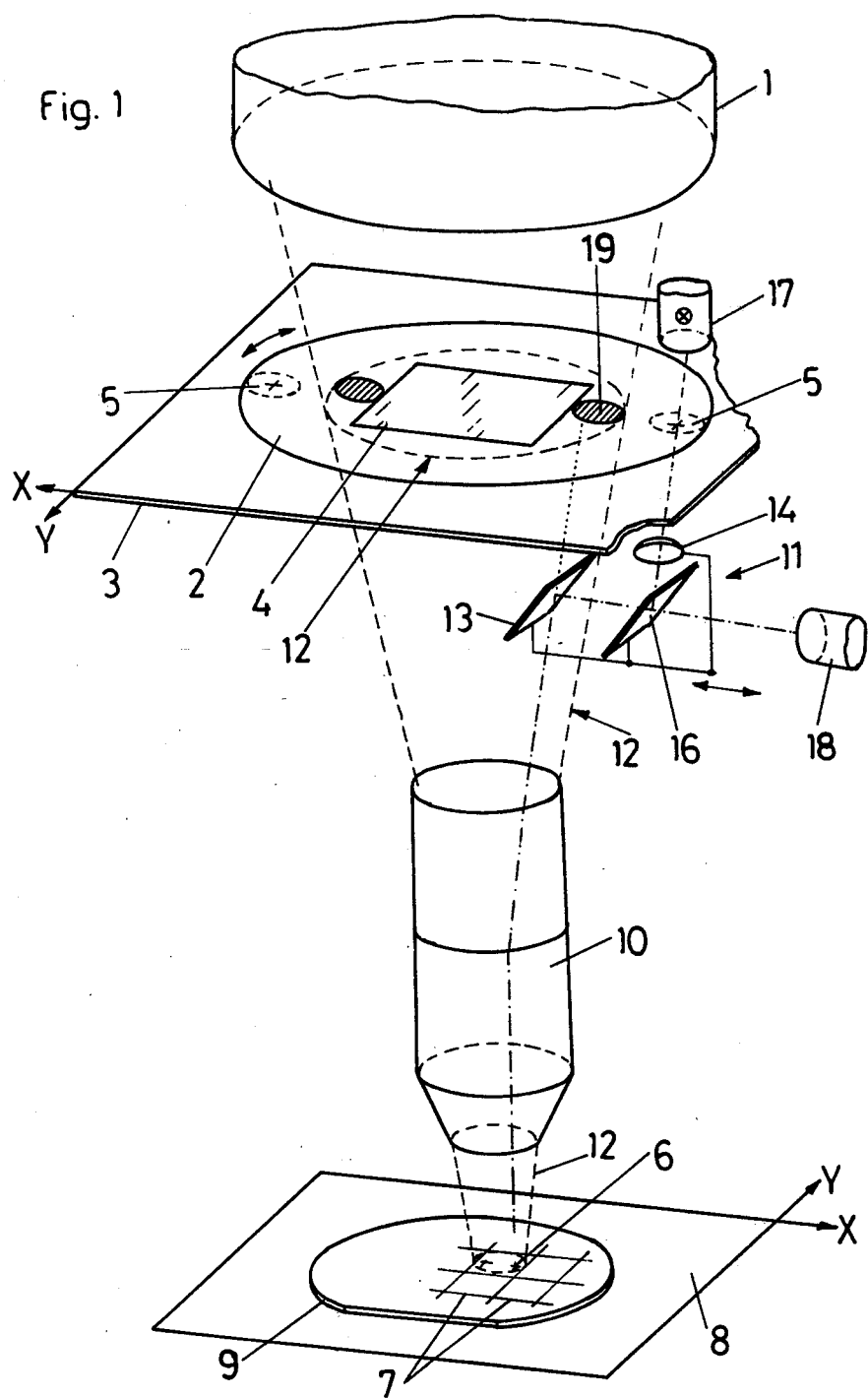
FIG. 1 shows a schematic oblique view of a device for the projection printing of masks on a semiconductor substrate.

FIG. 1 shows the substantial members of a device for partially exposing a semiconductor substrate. The substrate 9 rests on a substrate stage 8 which can be moved step-by-step in the direction of the XY-coordinates by means of devices not being illustrated. A mask stage 3 is disposed above the substrate stage 8, said mask stage receiving the mask 2 and also being continuously movable and, if required, pivotable in the direction of the X- and Y-coordinates. A projection lens 10 is disposed between the substrate stage 8 and the mask stage 3, which images the circuit pattern 4 of the mask 2 on the substrate 9 at the scale of 10:1. An exposure device 1 is provided above the mask stage 3. After each second exposure of the same area of the substrate by means of a mask an exact alignment of the mask relative to circuit elements or circuit patterns already present on the substrate has to be made, and for this purpose alignment patterns 5 are disposed on the mask 2, and alignment targets 6 on the substrate 9. The alignment targets 6 can be marked on the substrate together with the first exposure, or by means of a laser, for example. According to the invention the alignment patterns of the mask 2 and the alignment targets of the substrate 9 are positioned in non-conjugated areas in respect of the projection lens 10.

In order to be able to image the areas of the alignment targets and the alignment patterns into one another for the alignment process between the mask and the substrate auxiliary optical means 11 comprising first and second reflecting mirrors 13 and a correction lens 14 are provided. In the present embodiment said auxiliary optical means effect a parallel displacement of the light beams reflected by the alignment target. A light source 17 is provided for illuminating the alignment pattern 5 and the alignment targets 6 during the alignment process, the light of said light source effecting no change of the photosensitive layer disposed on the substrate 9.

The light produced by the light source 17 projects on the substrate 9 an image of the alignment pattern 5 by means of the correction lens 14, the reflecting mirrors 13 and 16 and the projection lens 10, said image together with the alignment target 6 being conveyed to a photoelectric plotting device 18 by back projection by means of the mirrors 13 and 16, and the correction lens 14, said plotting device deducing signals from the relative displacement of the targets, which can be used for controlling the positioning units (not illustrated) for aligning the mask and/or substrate. The reflecting mirror 16 is adapted to be semi-transmitting. For purposes of simplicity the illuminating and plotting devices as well as the auxiliary optical means are illustrated for one pair of targets 5 and 6 only.

After the alignment process the auxiliary optical means 11 are removed, and the substrate 9 is exposed. Thereby the circuit pattern 4 is transferred to one of chips 7. After exposure the substrate stage 8 is moved to the next chip. The required alignment process is carried out again by means of the auxiliary optical means 11, and exposure is effected subsequently.

By means of the above-mentioned device, the alignment patterns 5 can be disposed at any point of the mask. The alignment pattern can have any configuration as the alignment patterns are not transferred any more to the area of the alignment targets 6 of the substrate during exposure. The areas 19 of the mask 2 conjugated to the alignment targets 6 in respect of the projection lens 10 can be adapted to eliminate any changes of the alignment targets during further processing cycles of the substrate. In the case of a positive photoresist on the substrate the areas 19 of the mask can be light-tight, and in the case of a negative photoresist the areas 19 can be light-transmitting. Thus, during developing processes following exposure, the photoresist remains on the alignment targets 6 and protects them.

Figure 2:
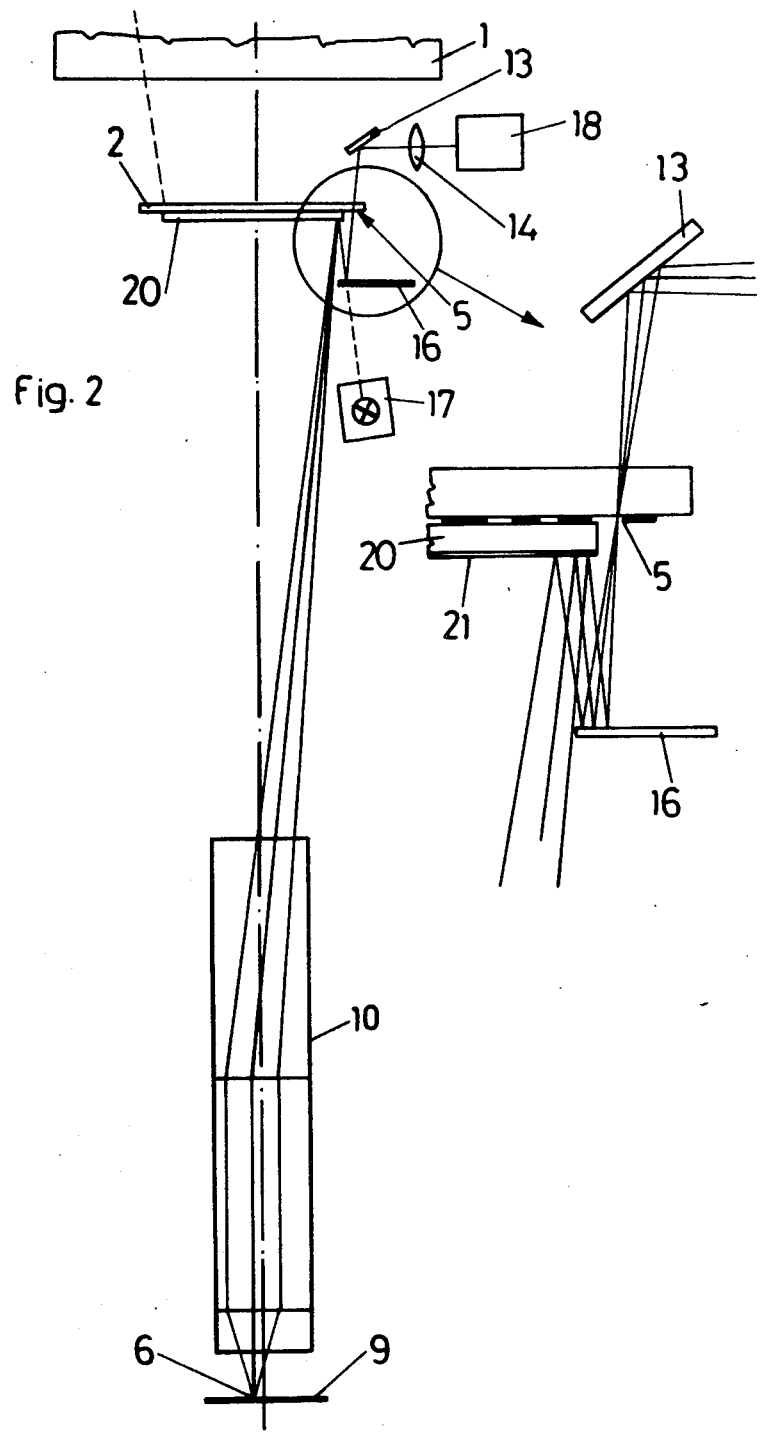
FIG. 2 shows the view of a second embodiment.

In the device according to FIG. 2 the mask 2 is sealed by a protective glass 20. A beamsplitting layer 21 is disposed on the free surface of said protective glass 20, said layer 21 substantially being transparent to the wavelength of the exposure radiation (e.g. $\lambda = 436$ nm), but reflecting the wavelength of the alignment radiation (e.g. $\lambda = 547$ nm).

The light produced by the alignment light source 17 partially penetrates a semitransparent mirror 16 and is thrown from the beam-splitting layer 21 on the protective glass 20 onto the alignment target 6 of the substrate 9 by means of the projection lens 10. By means of said light the alignment target 6 is imaged in the area of the alignment pattern 5 of the mask 2 by means of the projection lens 10, the beam-splitting layer 21 and the semitransparent mirror 16. It is essential that the prolongation of the light path in respect of the unbent beam path of the exposure radiation is of a predetermined value.

The images of the targets of the substrate and the mask are then simultaneously imaged on the photoelectric plotting device 18 by means of a further reflecting mirror 13 and auxiliary optical means 14.

It is an essential feature of this embodiment that the prolongation of the beam path is dimensioned in such a manner that an image of sufficient quality is produced in the alignment radiation. The prolongation substantially compensates for the aberrations being caused by the transition from the wavelength of the exposure radiation to the wavelength of the alignment radiation.

It is of importance that the alignment targets consist of lines or groups of lines radially extending towards the optical axis.

The areas 19 of the mask 2 being conjugated to the alignment targets 6 in respect of the projection lens 10 may, as already mention above, be adapted to be light-tight or light-transmitting. It is also possible to uncover the alignment targets 6 during certain exposures so that they will be removed by the following etching process. It is also possible to mark a further alignment target into the original target 6.

Figure 3:
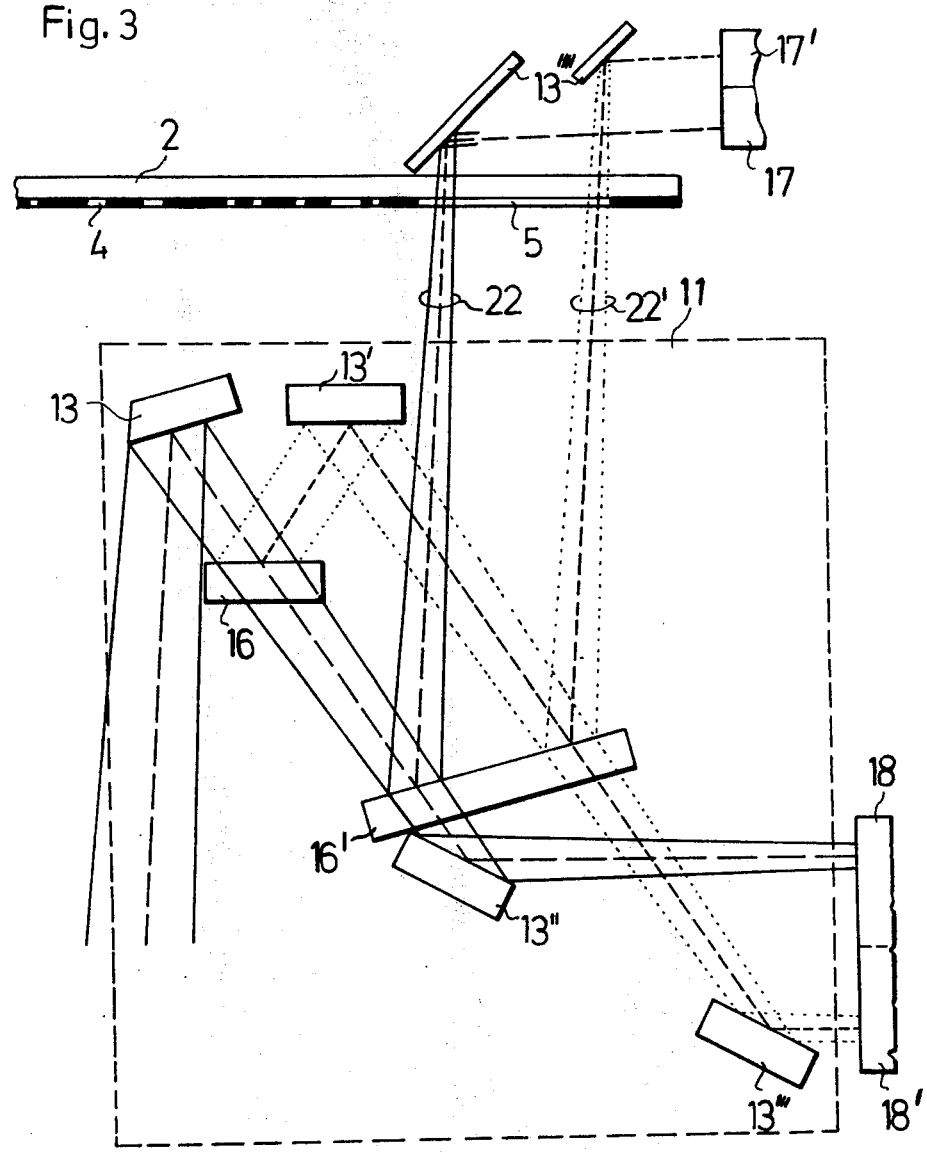
FIG. 3 shows auxiliary optical means for two different wave lengths of the alignment light.

The embodiment illustrated in FIG. 3 uses auxiliary optical means 11, which allow the alignment of mask 2 and substrate 9 with two different wave lengths of the alignment light. This is due to the fact that a high absorption of the image of the alignment pattern 5 and the alignment target 6 reflected by the substrate 9 is caused by interference effects, when the photoresist layer has a certain thickness on the surface of the substrate 9 resp. in the case of certain layer combinations. This causes again a relatively weak alignment signal. By changing over to a different wave length of the alignment light (e.g. from 547 nm to 579 nm), this disadvantage can be eliminated. According to the present embodiment, a beam of rays 22 of a certain wave length is by means of an alignment light source 17 cast through a window-shaped alignment pattern 5 of the mask 2. Said beam of rays 22 illuminates the alignment target 6 on the substrate 9 by means of mirrors 16' and 13 and the projection lens 10. The image of the alignment pattern 5 and the alignment target 6 are projected from a reflecting mirror 13" onto the photoelectric plotting device 18 by means of back projection.

The prolongation of the ray path of the beam of rays 22 in respect of the path of the exposure rays, which is due to the mirrors of the auxiliary optical means 11, is dimensioned in such a manner that the focusing aberration, which is caused by the projection lens 10 matching the exposure wave length, is corrected. If the wave length of the beam of rays 22 is highly reduced because of the afore-described effects, a beam of rays 22' of the alignment light source 17' having a different wave length can be used. Said beam of rays 22' is again cast onto the substrate 9 by means of mirrors 16', 13', 16, 13 and the projection lens 10, and the image, which is projected back, is directed onto a photoelectric plotting device 18' by means of reflecting mirrors 13'''. The total prolongation of said path of rays has, as already mentioned, a certain dimension so that the chromatic aberrations of the projection lens 10 are compensated.

Figure 3A:
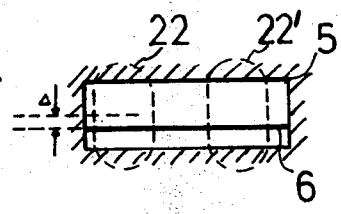
FIG. 3a shows an alignment pattern and an alignment target being imaged into one another.

FIG. 3a shows a window-shaped alignment pattern 5 on the mask 2 and the regions on which the beam of rays 22 and 22' impinge. It is of no importance which beam of rays is chosen for determining alignment aberrations normal to the longitudinal rims of the alignment pattern 5 resp. to the line-shaped alignment target 6.

By means of the above-described device the processor forms and arranges the alignment pattern on the mask 2 almost without any limitation. The same alignment targets of the substrate, or, after any number of exposures, new alignment targets of the substrate can be used for aligning the mask.

What is claimed is:

1. A device for the projection printing of the masks of a mask set onto a workpiece, particularly onto a semiconductor substrate for the manufacture of integrated circuits, said device comprising a projection lens for the imaging of the patterns of said masks on photosensitive layers of said workpiece in successive processing cycles, alignment patterns being disposed on said masks and alignment targets being disposed on said work piece, said alignment patterns of said masks being aligned with said alignment targets of said workpiece before imaging the respective mask pattern on said workpiece, wherein said alignment patterns of at least one of said masks and said alignment targets of said work piece are positioned in non-conjugated areas in respect of the projection lens, i.e. in areas which cannot be imaged into one another by means of said projection lens, and wherein auxiliary optical means are provided for the alignment process, said alignment targets of said workpiece and said alignment patterns of said mask being imaged into one another by means of said auxiliary optical means.

2. The device of claim 1, wherein said workpiece is coated with a positive photosensitive layer, the areas of at least one of said masks or the corresponding exposure radiation path, which are conjugated to said alignment targets of said workpiece in respect of said projection lens, being tight to the exposure radiation.

3. The device of claim 1, wherein said workpiece is coated with a negative, photosensitive layer, the areas of at least one of said masks or the corresponding exposure radiation path, which are conjugated to said alignment targets of said workpiece in respect of said projection lens, being transparent to the exposure radiation.

4. The device of claims 1 to 3, wherein said alignment patterns are disposed on at least one of said masks outside the projection area of said projection lens.

5. The device of claims 1 to 4, wherein said auxiliary optical means are disposed between said projection lens and said mask.

6. The device of claims 1 to 5, wherein said auxiliary optical means have at least two reflecting mirrors.

7. The device of claim 6, wherein a correction lens is provided.

8. The device of claims 1 to 7, wherein a protective glass is disposed on the side of said mask directed towards said projection lens, first mirrors being disposed on the surface of said protective glass in areas being conjugated to said alignment targets of said substrate.

9. The device of claim 8, wherein said first mirrors are adapted to reflect the wavelength of the alignment radiation and to transmit the wavelength of the exposure radiation.

10. The device of one of claims 8 or 9, wherein second mirrors are disposed at a distance from said protective glass, said second mirrors imaging the images of said alignment targets in the respective alignment patterns of said mask, said images being reflected by said first mirrors of said protective glass.

11. The device of claims 1 to 10, wherein said auxiliary optical means or parts thereof are adapted to be moved into the projection area of said projection lens.

12. A device according to claim 1 wherein said auxiliary optical means comprise a first pair of mirrors for imaging said alignment pattern of said mask and said alignment target of said substrate into one another, the prolongation of the ray path of the alignment light in respect of the ray path of the exposure light being effected by said first pair of mirrors is dimensioned in such a manner that the focusing aberration of said projection lens is compensated for a first wave length of said alignment light.

13. A device according to claim 12 wherein said auxiliary optical means comprise a second pair of mirrors effecting a further prolongation of the ray path of the alignment light, the total prolongation effected by said first and said second pair of mirrors is dimensioned in such a manner that the focusing aberration of said projection lens is compensated for a second wave length of said alignment light.

14. A device according to claims 12 or 13 wherein said alignment pattern of said mask is a transparent window and said alignment target of said substrate is line-shaped, and wherein an alignment aberration between said mask and said substrate is determined by measuring the distance between said line-shaped alignment target and two parallel rims of said window-shaped alignment pattern.

* * * * *

Dedication 4,269,505.—*Herbert E. Mayer*, Eschen, Austria. DEVICE FOR THE PROJECTION PRINTING OF THE MASKS OF A MASK SET ONTO A SEMICONDUCTOR SUBSTRATE. Patent dated May 26, 1981. Dedication filed Feb. 20, 1990, by the assignee, Mercotrust Aktiengesellschaft.

Hereby dedicates to the Public the remaining term of said patent.
[ *Official Gazette April 17, 1990* ]